(12) United States Patent
Forck et al.

(10) Patent No.: US 6,512,323 B2
(45) Date of Patent: *Jan. 28, 2003

(54) PIEZOELECTRIC ACTUATOR DEVICE

(75) Inventors: Glen F. Forck, Peoria, IL (US); Larry G. Waterfield, Peoria, IL (US)

(73) Assignee: Caterpillar Inc., Peoria, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/532,596

(22) Filed: Mar. 22, 2000

(65) Prior Publication Data

US 2002/0063496 A1 May 30, 2002

(51) Int. Cl.⁷ .......................... H01L 41/083; H02N 2/00
(52) U.S. Cl. ........................ 310/332; 310/330; 310/331
(58) Field of Search ................... 310/332, 330, 310/331

(56) References Cited

U.S. PATENT DOCUMENTS

| | | | |
|---|---|---|---|
| 3,182,284 A | 5/1965 | Green | 340/9 |
| 3,321,648 A | 5/1967 | Kolm | 310/8.2 |
| 3,666,979 A | 5/1972 | McElroy | 310/9.6 |
| 4,011,474 A | 3/1977 | O'Neill | |
| 4,047,060 A | 9/1977 | Schafft | 310/322 |
| 4,087,716 A | 5/1978 | Heywang | 310/332 |
| 4,360,562 A | 11/1982 | Endo et al. | 428/317.7 |
| 4,954,811 A | * 9/1990 | Chatigny et al. | 340/550 |
| 5,034,649 A | * 7/1991 | Chida et al. | 310/332 |
| 5,148,077 A | 9/1992 | Grawey | |
| 5,315,204 A | 5/1994 | Park | 310/339 |
| 5,471,721 A | 12/1995 | Haertling | 29/25.35 |
| 5,485,437 A | 1/1996 | Gregg | 369/44.14 |
| 5,632,841 A | 5/1997 | Hellbaum et al. | 156/245 |
| 5,761,782 A | 6/1998 | Sager | |
| 5,831,371 A | 11/1998 | Bishop | 310/328 |
| 5,844,349 A | * 12/1998 | Oakley et al. | 310/358 |
| 5,849,125 A | 12/1998 | Clark | 156/222 |
| 5,949,294 A | * 9/1999 | Kondo et al. | 331/68 |
| 6,030,480 A | 2/2000 | Face, Jr. et al. | 156/160 |
| 6,246,153 B1 | * 6/2001 | Bishop et al. | 310/316.01 |
| 6,291,930 B1 | * 9/2001 | Sager | 310/331 |

OTHER PUBLICATIONS

Appl 07/589,855 (abandoned) published Jul. 14, 1993 as EP Appl and incorporated by ref in U.S. Pat No. 5,148,077.

* cited by examiner

Primary Examiner—Brian Sircus
Assistant Examiner—Michael C. Zarroli

(57) ABSTRACT

A piezoelectric actuator of multiple piezoelectric layers in an integrally bonded laminate structure. Alternating layers of electrically active ceramic material and conductive or non-conductive substrate material are stacked with layers of conductive or non-conductive thermally activated adhesive therebetween. The stacked layers are heated to flow the adhesive and subsequently cooled to effect an integral bonding of the layers and a doming of the stacked device. Conductive substrate materials and adhesive materials may be used, with every other substrate layer being reverse poled to create alternating positive and negative electrode substrate layers capable of applying an electric field to active ceramic layers therebetween. Alternatively, electrically active layers are provide with thin metal electrode layers on opposing surfaces which are capable of applying an electric field to active ceramic layers therebetween.

4 Claims, 1 Drawing Sheet

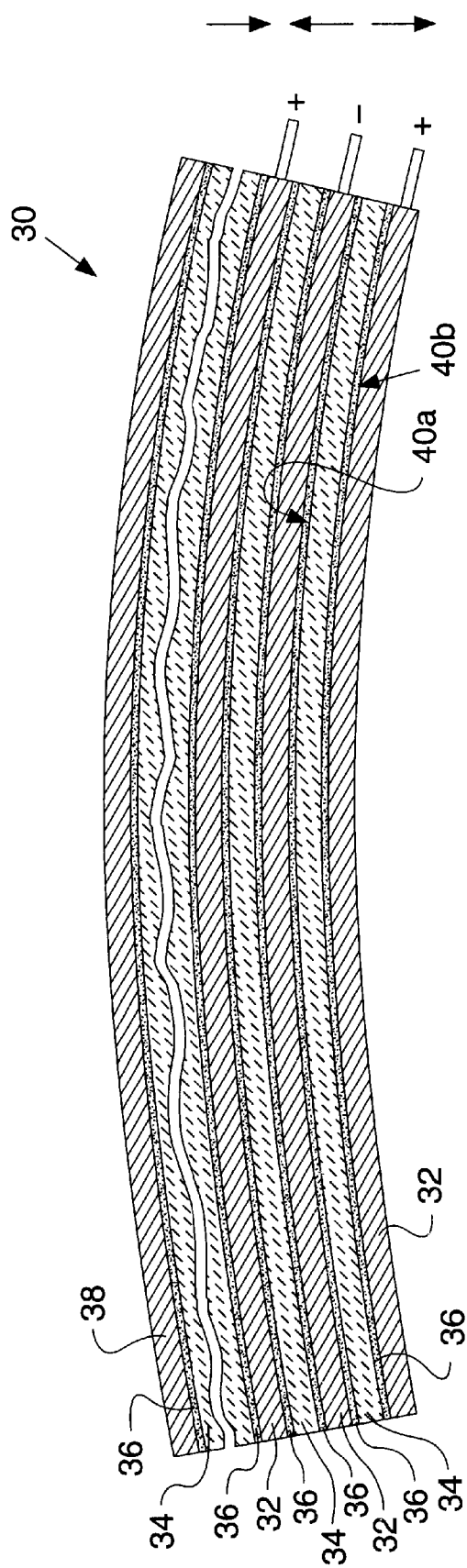

PIEZOELECTRIC ACTUATOR DEVICE

TECHNICAL FIELD

The present invention relates generally to actuator devices and, more particularly, to a single actuator device of multiple active piezoelectric layers.

BACKGROUND ART

Piezoelectric and electrostrictive materials develop a polarized electric field when placed under stress or strain. Conversely, these materials undergo dimensional changes in an applied electric field. The dimensional change (i.e. expansion or contraction) of a piezoelectric or electrostrictive material is a function of the applied electric field. Piezoelectric and electrostrictive materials can possess a large number of combined and useful properties such as piezoelectric (electric field dependent strain), electrostrictive, dielectric, pyroelectric (temperature dependent polarization), ferroelectric (electric field dependent polarization) and electrooptic (electric field dependent optical birefringence). These devices have a wide range of application including actuators, switches, pumps, speakers, sensors, switches, hydrophones, hydrospeakers, adaptive optics, variable focus mirrors and lenses, vibrators, benders, accelerometers, strain gauges and saddle inchworms.

Various forms of electroactive devices are known in the prior art. The simplest of such prior devices are the direct mode actuators, such as magnetostrictive actuators and piezo stacks, which make direct use of a change in the dimensions of the material when activated by an electric field, without amplification of the actual displacement. The direct mode actuator includes a piezoelectric or electrostrictive ceramic plate sandwiched between a pair of electrodes formed on its major surfaces. The device is generally formed of a material which has a sufficiently large piezoelectric and/or electrostrictive coefficient to produce the desired strain in the ceramic plate. Although exhibiting high force, these direct mode actuators suffer from the disadvantage of achieving only very small displacement (strain), at best a few tenths of a percent.

Indirect mode actuators provide greater displacement than direct mode actuators. They achieve strain amplification via external structures. An example of an indirect mode actuator is a flextensional transducer, such as that disclosed in U.S. Pat. No. 4,999,819, now commonly known as a "Moonie". Flextensional transducers are composite structures composed of a piezoelectric ceramic element and a metallic shell, stressed plastic, fiberglass or similar structure. The actuator movement of conventional flextensional devices commonly occurs as a result of expansion in the piezoelectric material which mechanically couples to an amplified contraction of the device in the transverse direction. In operation, they can exhibit several orders of magnitude greater displacement than that produced by direct mode actuators.

Other examples of indirect bending mode actuators include unimorph and bimorph actuators. One type of unimorph is a structure composed of a single piezoelectric element externally bonded to a flexible metal foil which is stimulated by the piezoelectric element when activated with a changing voltage and results in an axial buckling or deflection as it opposes the movement of the piezoelectric element. The actuator movement for a unimorph can be by contraction or expansion. Unimorphs can exhibit a strain of as high as 10% but can only sustain loads which are less than one pound.

A conventional bimorph device includes an intermediate flexible metal foil sandwiched between two piezoelectric elements. Electrodes are bonded to each of the major surfaces of the ceramic elements and the metal foil is bonded to the inner two electrodes. Bimorphs exhibit more displacement than unimorphs because under the applied voltage one ceramic element will contract while the other expands. Bimorphs can exhibit strains up to 20%, but similar to unimorphs, they cannot sustain loads greater than one pound.

Although the indirect bending mode actuators can exhibit larger strains than direct mode actuators, the load bearing capacity of these devices decreases as the strain increases, resulting in very small load bearing capacities.

U.S. Pat. No. 5,471,721 discloses a pre-stressed unimorph now commonly known as "RAINBOW", which is an acronym for Reduced And INternally Biased Oxide Wafer. In the RAINBOW device, a first surface of a wafer becomes a metallic/conductive reduced form of the ceramic material. In addition, the wafer is concave shaped due to (1) volume shrinkage of the reduced material with respect to the unreduced material and (2) the difference in thermal expansion between the reduced side and the dielectric (unreduced) side. As a result of the concave shape, the reduced side is in tension while the dielectric side is in compression at zero applied field. The net effect is to place the electrically active side (dielectric side) of the RAINBOW wafer in compression, which is a desirable configuration for reliability, increased polarization, load bearing capability and long life. The RAINBOW devices exhibit equal or greater strains and sustain greater loads than bimorphs and conventional unimorphs, but the improvement in load bearing capability is still only moderately better. Furthermore, the chemical reduction process for fabricating RAINBOW actuators releases vapors, such as lead vapors, from the wafer into the atmosphere.

Recently NASA has developed another pre-stressed unimorph now commonly known as "THUNDER", which is an acronym for THin layer composite UNimorph ferroelectric Driver and sEnsoR. THUNDER is a composite structure constructed with a PZT (lead zirconate titanate) piezoelectric ceramic layer which is electroplated on its two major faces. A metal pre-stress layer is adhered to the electroplated surface on at least one side of the ceramic layer by an adhesive layer, which NASA calls "LaRC-SI™.". During manufacture of the THUNDER actuator, the ceramic layer, the adhesive layer and the first pre-stress layer are simultaneously heated to a temperature above the melting point of the adhesive, and then subsequently allowed to cool, thereby re-solidifying and setting the adhesive layer. During the cooling process the ceramic layer becomes strained, due to the higher coefficients of thermal contraction of the metal pre-stress layer and the adhesive layer than of the ceramic layer. Also, due to the greater thermal contraction of the laminate materials than the ceramic layer the ceramic layer deforms in an arcuate shape having a normally concave face.

The THUNDER device reportedly generates significantly greater output deformation for a given voltage input than do prior ferroelectric and ferrostrictive devices. The THUNDER device, however, still represents only moderate improvement in load bearing capability. NASA does suggest that for certain applications requiring more mechanical output force than can be provided by a single piezoelectric device, two or more devices can be arranged in a "stacked spoons" configuration. A three-THUNDER device arrangement would have a single piezoelectric device discretely bonded to a second single piezoelectric device by a compliant layer, such as an adhesive elastomer, which would then be bonded to a third single piezoelectric device by another compliant layer, thus electrically isolating one device from another. Each single device is independently manufactured prior to stacking with other devices and includes a single active piezoelectric ceramic layer with deposited electrode layers on opposing surfaces, a pre-stressing adhesive layer adjacent one electrode layer and an optional reinforcing material adjacent the adhesive layer. Each ceramic layer has a positive polarity electrode layer and a negative polarity electrode layer associated therewith, such that when stacked, the compliant layer is necessary to insulate un-like poles from each other. Although the stacked THUNDER devices represent higher displacement and force capabilities than prior devices, these devices are only loosely stacked and require a high number of electrodes (2 per device) with insulation therebetween.

It is known that the dome height in thermally pre-stressed bender actuators with thicker laminate layers is less sensitive to changes in temperature than with thinner layers. A thicker ceramic layer, however, requires a higher voltage to achieve the same electric field as a thinner ceramic layer. This represents a further disadvantage of such actuator devices as RAINBOW and THUNDER.

DISCLOSURE OF THE INVENTION

While the invention will be described in connection with certain embodiments, it will be understood that the invention is not limited to these embodiments. On the contrary, the invention includes all alternatives, modifications and equivalents as many be included within the spirit and scope of the present invention.

The present invention discloses a piezoelectric actuator, comprising alternating layers of a conductive substrate material and layers of an electrically active ceramic, each alternating layer adhered to the next with an intermediate conductive, thermally-activated adhesive layer to form a bonded laminate, wherein the conductive substrate layers alternate between positive and negative polarity such that the substrate layers are electrodes capable of providing an electric field to each of the ceramic layers.

BRIEF DESCRIPTION OF THE DRAWINGS

For a better understanding of the present invention, reference may be made to the accompanying drawings in which:

The Figure is a cross-sectional view of one embodiment of a single device of the present invention having three integrally bonded active piezoelectric layers.

BEST MODE FOR CARRYING OUT THE INVENTION

With reference to the Figure, a piezoelectric device of the present invention, indicated generally at 30, is shown as a multiple layer laminate having a domed or arcuate structure. The laminate device 30 includes alternating layers of a substrate material 32 and an electrically active or piezoelectric ceramic 34. Between each alternating layer 32 and 34 is an adhesive layer 36 of the thermally-activated type. Optionally, the laminate device 30 may include a top layer 38, which is a thin, stress-relieving layer. The layers forming the laminate device 30 may be circular, rectangular, square or any other regular or irregular shape, with circular being the preferred configuration.

The material forming alternating substrate layers 32 may be virtually any material, such as fiberglass, beryllium, copper, graphite, stainless steel, etc. The substrate layers 32 may be such as to provide reinforcement to the laminate structure. In one embodiment of the present invention, the substrate layers 32 are formed of a conductive material, as will be discussed in further detail hereafter.

The material forming alternating active layers 34 may be any active ceramic material, such as piezoelectric, electrostrictive or other ferroelectric ceramics. The ceramic wafer 34 may optionally be provided with a thin metal conductive coating (not shown) on opposing surfaces 40a and 40b, which if necessary, may function as electrodes, as described in further detail hereafter. The thin metal layers are typically applied by vacuum metallization. By way of example and not limitation, such thin metal layers could comprise nickel, silver, copper, aluminum, tin, gold, chromium or alloys thereof.

The adhesive layers 36 applied between alternating layers 32 and 34 include any thermally-activated adhesive. When the stacked layers 32, 34, 36 and optionally 38 are heated to an elevated temperature, the adhesive layers 36 begin to flow. Upon cooling of the layers to ambient temperature, one layer is bonded to the next by an adhesive layer 36 to form an integrally bonded, multiple layer laminate device 30. The temperature to which the layers must be heated to activate the adhesive depends upon the particular adhesive used, but is typically in the range of about 100 C to about 300 C. Thermal set epoxies typically require heating in the lower end of this range, whereas hot melt thermal plastic requires the higher activation temperatures.

In a further feature of the device of the present invention, as a result of the difference in coefficients of thermal expansion of the materials comprising the multi-layer device 30, as the layers cool to ambient temperature at different rates, mechanical stress is automatically imparted into the layers, causing the doming effect, as shown in the Figure.

Depending upon the polarity of the voltage being applied, the piezoelectric device 30 is caused to expand or contract in the longitudinal direction, as indicated by the arrows in the Figure. The voltage is applied by connecting a voltage source (not shown) to electrodes within the device 30.

In a preferred embodiment of the invention, as depicted in the Figure, the substrate layers 32 are comprised of conductive material and are polarized such that they may function as the electrodes for applying an electric field to the active layers 34. To this end, every other substrate layer 32 is reverse poled such that substrate layers 32 alternate between positive and negative polarity. These alternating polarity substrate layers 32 are bonded to the active layers 34 by a conductive adhesive 36, such that upon application of the voltage, an electric field is applied from the electrode substrate layers 32, through the adhesive 36 and through the optional thin metal layers to the electrically active ceramic layers 34. As shown in the Figure, adjacent active ceramic layers 34 share an intermediate electrode substrate layer 32, thus eliminating an electrode layer therebetween, as compared, for example, to the stacked prior art THUNDER devices described above. The sharing of electrodes and alternating polarity also eliminates the need for an insulating layer between unlike electrodes, as in the stacked THUNDER devices.

In an alternative embodiment of the present invention, the thin metal conductive coatings applied to opposing surfaces 40a, 40b of the ceramic layers 34 may function as the electrodes for applying an electric field to the active layers 34. To this end, each of top surfaces 40a may be provided with a positive polarity and each of bottom surfaces 40b conversely provided with a negative polarity. A non-conductive substrate material 32 and/or non-conductive adhesive 36 may then be used to insulate between the stacked unlike poles of the top surface 40a of one active layer 34 and the bottom surface 40b of an adjacent active layer 34. Also to this end, alternating active layers 34 may have the thin metal electrode layers subjected to reverse poling such that like poles oppose each other between adjacent active layers 34, thus eliminating the need for insulation therebetween. Consequently, the adhesive layers 36 and substrate materials 32. may be comprised of conductive or non-conductive materials.

To manufacture the integrally bonded laminate piezoelectric device 30 of the present invention, a stack is formed from repeating layers of substrate material 32, adhesive layer 36, active ceramic layer 34, adhesive layer 36. The number of repeating layers depends upon the desired force in the final actuating device 30. The stack may be topped with a thin stress-relieving layer 38, if desired. The stacked materials are then all brought to an elevated temperature at which the adhesive layers 36 will begin to flow, which temperature is dependent upon the particular adhesive material used and is typically in the range of about 100 C to about 300 C.

The entire stacked assembly is then slowly cooled to ambient temperature, whereby the adhesive resets and integrally bonds the stacked material together. The difference in coefficients of thermal expansion of the materials will cause a slight doming of the actuator device during cooling and result in large internal stresses. If the substrate layers are conductive, every other layer is reverse poled and the substrate layers 32 are connected to a voltage source. Alternatively, thin metal layers on the opposing surfaces of the active ceramic layers are connected to a voltage source, and if the substrate layers 32 are non-conductive, every other active layer is subjected to reverse poling of the thin metal electrode layers.

A typical stack of unimorph actuators of the prior art comprises several laminated disks, each disk having a single piezoelectric layer, with each disk having an adhesive, insulating layer bonding it to the next disk, as in the stacked THUNDER devices of FIG. 1. In the present invention, multiple piezoelectric layers are initially bonded together to form a single integrally stacked device. A device of the present invention having several piezoelectric layers of equal thickness to that used in a several-disk stacked THUNDER actuator will form a thinner device. Furthermore, due to the multiple laminate layers of the present invention, the device will be less sensitive to changes in temperature while still offering the lower operating voltage of a device with thinner layers.

INDUSTRIAL APPLICABILITY

With reference to the drawings and in operation, a single piezoelectric stacked device is formed from repeating layers of substrate material 32, adhesive layer 36, active ceramic layer 34, adhesive layer 36. The stack may be topped with a thin stress-relieving layer 38, if desired. The stacked materials are then heated to a temperature sufficient to cause the adhesive layers 36 to flow. The entire stacked assembly is then slowly cooled to ambient temperature, whereby the adhesive resets and integrally bonds the stacked material together. The differential thermal compression rates of the materials comprising the device will cause a slight doming of the actuator device during cooling and result in large internal stresses. Thus, a stacked bender actuator device is formed by simultaneously laminating together a plurality of piezoelectric layers and substrate layers into an integrally bonded structure, as opposed to prior art piezo stacks comprising individual single-active layer piezoelectric devices separately bonded together in tandem with each individual device being electrically insulated from adjacent devices in the stack.

In the event the substrate layers are conductive, every other layer may be reverse poled and the substrate layers 32 are connected to a voltage source. Alternatively, thin metal layers on the opposing surfaces 40a, 40b of the active ceramic layers 34 are connected to a voltage source. In the event the substrate layers 32 are non-conductive, every other active layer 34 is subjected to reverse poling of the thin metal electrode layers such that like poles face each other.

Upon application of a voltage to the electrodes, an electric field is applied across the piezoelectric layers causing expansion or contraction of the layers with a high magnitude of strain (deflection) similar to that produced by the indirect mode pre-stressed unimorphs and a high force output similar to that produced by the direct mode actuators, and with less thermal sensitivity. Thus, in use, the piezoelectric actuators exhibit a combination of the force advantages in a stack design with the displacement advantages of the bender moment associated with unimorphs and bimorphs.

Other aspects, objects and advantages of the present invention can be obtained from a study of the drawings, the disclosure and the appended claims.

What is claimed is:

1. A piezoelectric actuator, comprising:

alternating layers of a conductive substrate material and layers of an electrically active ceramic having opposing surface electrodes, each alternating layer adhered to the next with an intermediate, conductive, thermally-activated adhesive layer to form a bonded laminate, wherein each ceramic layer has one opposing surface electrode of positive polarity and one opposing surface electrode of negative polarity, each connectable to a voltage source to thereby provide an electric field to each of the ceramic layers, wherein the opposing surface electrodes for every other electrically active ceramic layer are reverse poled, and wherein the bonded laminate has an arcuate structure.

2. An actuator as recited in claim 1, wherein the electrically active ceramic is a piezoelectric material.

3. An actuator as recited in claim 1, wherein the electrically active ceramic is an electrostrictive material.

4. An actuator as recited in claim 1, wherein the bonded laminate further comprises a top stress-relieving layer.

* * * * *